United States Patent [19]

Suzuki et al.

[11] Patent Number: 5,653,952
[45] Date of Patent: Aug. 5, 1997

[54] PROCESS FOR SYNTHESIZING DIAMOND USING COMBUSTION METHOD

[75] Inventors: Tomio Suzuki; Yoshiaki Morinishi, both of Kobe, Japan

[73] Assignee: Kabushiki Kaisha Kobe Seiko Sho, Kobe, Japan

[21] Appl. No.: 104,040

[22] PCT Filed: Dec. 18, 1992

[86] PCT No.: PCT/JP92/01655

§ 371 Date: May 9, 1994

§ 102(e) Date: May 9, 1994

[87] PCT Pub. No.: WO93/12273

PCT Pub. Date: Jun. 24, 1993

[30] Foreign Application Priority Data

Dec. 18, 1991 [JP] Japan ................. 3-335128
Mar. 19, 1992 [JP] Japan ................. 4-063707

[51] Int. Cl.⁶ ............................................ C01B 31/06
[52] U.S. Cl. ..................... 423/446; 427/249; 117/1; 117/104
[58] Field of Search ................ 423/446; 427/249; 117/1, 104

[56] References Cited

U.S. PATENT DOCUMENTS

| | | | |
|---|---|---|---|
| 4,940,015 | 7/1990 | Kobashi et al. | 118/723 |
| 5,006,203 | 4/1991 | Purdes | 423/446 |
| 5,066,938 | 11/1991 | Kobashi et al. | 338/225 D |
| 5,086,014 | 2/1992 | Miyata et al. | 437/103 |
| 5,107,315 | 4/1992 | Kumagai et al. | 357/22 |
| 5,135,730 | 8/1992 | Suzuki et al. | 423/446 |
| 5,160,405 | 11/1992 | Miyauchi et al. | 156/643 |
| 5,273,618 | 12/1993 | Komaki et al. | 423/446 |
| 5,387,310 | 2/1995 | Shiomi et al. | 423/446 |

FOREIGN PATENT DOCUMENTS

| | | | |
|---|---|---|---|
| 31 26 050 A1 | 1/1983 | Germany. | |
| 1-61397 | 8/1989 | Japan. | |
| 1-239091 | 9/1989 | Japan | 423/446 |
| 2-307898 | 12/1990 | Japan. | |
| 3-93695 | 4/1991 | Japan. | |
| 3-208892 | 9/1991 | Japan | 423/446 |

*Primary Examiner*—Michael Lewis
*Assistant Examiner*—Stuart L. Hendrickson
*Attorney, Agent, or Firm*—Oblon, Spivak, McClelland, Maier & Neustadt, P.C.

[57] ABSTRACT

A modified process for synthesizing diamond having developed by further improving a process of diamond synthesis based on combustion method, which provides diamond grains 1.5 mm or larger in crystal diameter at good economy. The process comprises burying one or two or more seed crystal diamond grain(s) 2 into the surface of a substrate 1, and striking a combustion flame on said seed crystal diamond grain(s) 2 while cooling the substrate 1 to thereby allow diamond to grow on the seed crystal diamond 2 into a larger diamond grain.

7 Claims, 2 Drawing Sheets

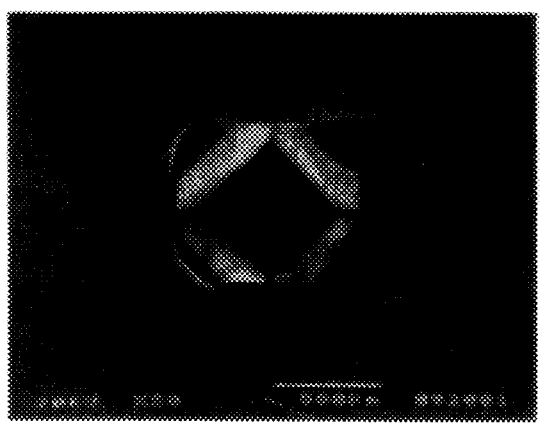
FIG. 1
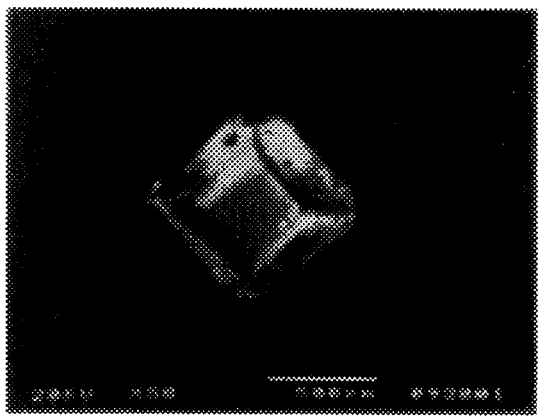
FIG. 2
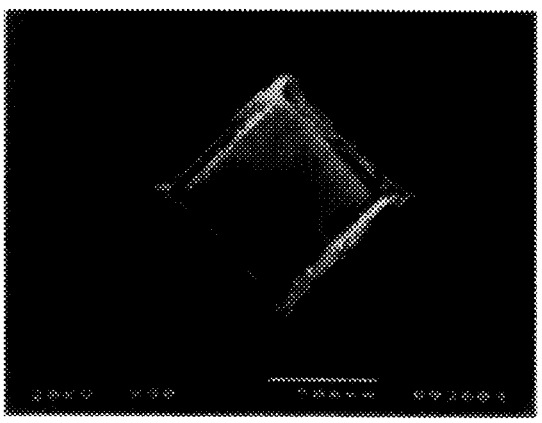
FIG. 3    h
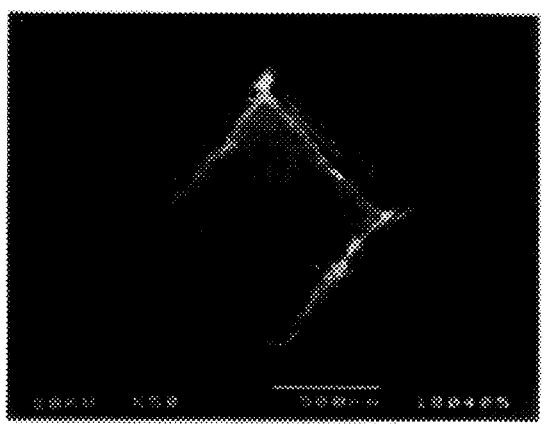
FIG. 4    17 hr
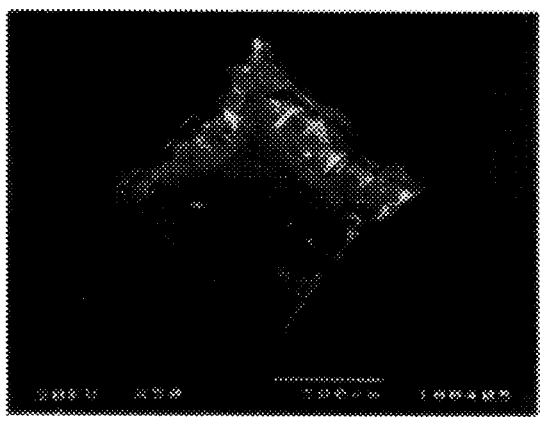
FIG. 5
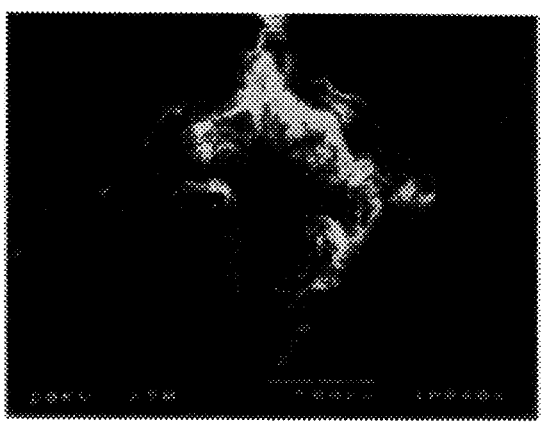
FIG. 6    26 hr 500 μm or more in diameter at good economy.

PROCESS FOR SYNTHESIZING DIAMOND USING COMBUSTION METHOD

INDUSTRIAL FIELD

The present invention relates to combustion method, i.e., a low pressure vapor phase synthetic process for artificially synthesizing diamond, which comprises, for example, combusting a hydrocarbon fuel gas and an oxidizing agent in a burner and striking the combustion flame on the surface of a substrate being set facing the burner to synthesize diamond. The present invention relates to a process for synthesizing diamond using combustion method, which provides diamond crystals larger than the conventional ones in diameter.

PRIOR ART

Artificial diamonds can be synthesized by either high pressure synthetic process or low pressure vapor phase synthetic process. Recently, there is proposed, as one of the low pressure vapor phase synthetic processes for synthesizing diamond, a combustion method in which combustion flame is used.

The process for synthesizing diamond using combustion method comprises, as shown in FIG. 8(a), combusting a hydrocarbon fuel and the like such as acetylene, ethylene, methane, propane, methanol, and ethanol as the carbon source for depositing diamond in a burner 11, using pure oxygen as the oxidizing agent being mixed at an amount far lower than the stoichiometric mixing ratio. In this manner, a specified flame 12 can be obtained by controlling the conditions for the combustion. Then, as shown in FIG. 8(b), a substrate 15 is placed inside a flame 14 denoted "feather" and which generates at the vicinity of the fire outlet 13, while forcibly cooling the substrate 15 using a cooling means being provided to the substrate holder 16 to maintain the substrate in the temperature range of from 600° to 1,200° C. Diamond can be synthesized in this way on the surface of the substrate 15.

However, most of the conventional processes for synthesizing diamond using combustion method heretofore proposed are in fundamental processes of experimental scale, and hence problems concerning the burners for use in the combustion and the cooling methods remain yet to be solved. The present applicants proposed modified processes for overcoming those problems in Japanese patent application Nos. 2-111263 and 2-43657.

Since then, the present applicants have attempted to synthesize diamond on the surface of a substrate using the above modified synthetic process. As a result, it has been found that the process for synthesizing diamond using combustion method is of best economy among the low pressure vapor phase synthetic processes, but that it is extremely difficult to synthesize large diamond crystals on the surface of a substrate. More specifically, the diamond grains having grown by this process were found to have a maximum size in the range of from about 100 to 300 μm, and when an attempt was made to obtain a diamond grain exceeding this maximum size range, graphite and carbon began to deposit on the surface of the diamond crystals with increasing duration of deposition. Accordingly, it was found that diamond crystals larger than about 100 to 300 μm in size cannot be synthesized by the conventional process for synthesizing diamond using combustion method.

In the light of such circumstances, the present applicants further modified the process for synthesizing diamond using combustion method to newly develop a process capable of synthesizing diamond crystal grains larger in diameter. That is, the substrate for synthesizing diamond thereon was arranged in such a manner that it may cross the axial center of the burner, and the distance between the substrate and the front end of the burner was gradually increased with the passage of time from 5 mm at the initial stage of the synthesis. This process for synthesizing diamond using combustion method was applied for patent as Japanese patent application No. 2-205412.

The above process enabled synthesis of diamond crystals as large as about 500 μm in diameter over two hours of synthesis. However, it was found impossible to obtain larger diamond grains of fine quality by simply controlling deposition conditions such as the distance between the surface of the substrate and the front end of the burner, the oxygen to acetylene ratio, and the cooling capacity, because graphite and carbon began to deposit on the surface of the diamond crystals after once a diamond crystal as large as about 500 μm in diameter was obtained.

Accordingly, an object of the present invention is to further improve the process for synthesizing diamond using combustion method to thereby obtain a diamond crystal as large as 500 μm or more in diameter at good economy.

DISCLOSURE OF THE INVENTION

The process according to the present invention comprises striking a combustion flame on the surface of a substrate having buried therein as seed crystals, one or more diamond grains, e.g., low cost industrial use diamond crystals 800 μm in diameter having been produced by high temperature and high pressure process, to thereby allow the seed diamond crystals to grow into larger diamond grains.

In the process above, a planar and stable growth of diamond crystal can be achieved by allowing the combustion flame to collide with the (100) plane of the seed diamond crystal. Furthermore, the use of a substrate of a metal based on copper or on aluminum is preferred, because they are soft enough that the seed diamond crystal grains can be easily buried in the surface thereof, and because they are inexpensive metals having high thermal conductivity.

BRIEF DESCRIPTION OF THE DRAWINGS

FIG. 1 is an explanatory figure showing the state of a diamond grain for use as a seed crystal for synthesizing diamond according to the combustion method of the present invention; FIG. 2 is an explanatory figure showing the state of a diamond grain used as a seed crystal after 5 hours since the initiation of the process for synthesizing diamond according to the combustion method of the present invention; FIG. 3 is an explanatory figure showing the state of a diamond grain used as a seed crystal after 11 hours since the initiation of the process for synthesizing diamond according to the combustion method of the present invention; FIG. 4 is an explanatory figure showing the state of a diamond grain used as a seed crystal after 17 hours since the initiation of the process for synthesizing diamond according to the combustion method of the present invention; FIG. 5 is an explanatory figure showing the state of a diamond grain used as a seed crystal after 20 hours since the initiation of the process for synthesizing diamond according to the combustion method of the present invention; FIG. 6 is an explanatory figure showing the state of a diamond grain used as a seed crystal after 26 hours since the initiation of the process for synthesizing diamond according to the combustion method of the present invention; FIG. 8 is an explanatory figure illustrating a conventional technology; wherein FIG. 8(a) is an explanatory figure showing the state of a burner flame, and FIG. 8(b) is an explanatory figure of a state in which a substrate is set on a burner flame.

BEST MODE OF CARRYING OUT THE INVENTION

Figure 7:
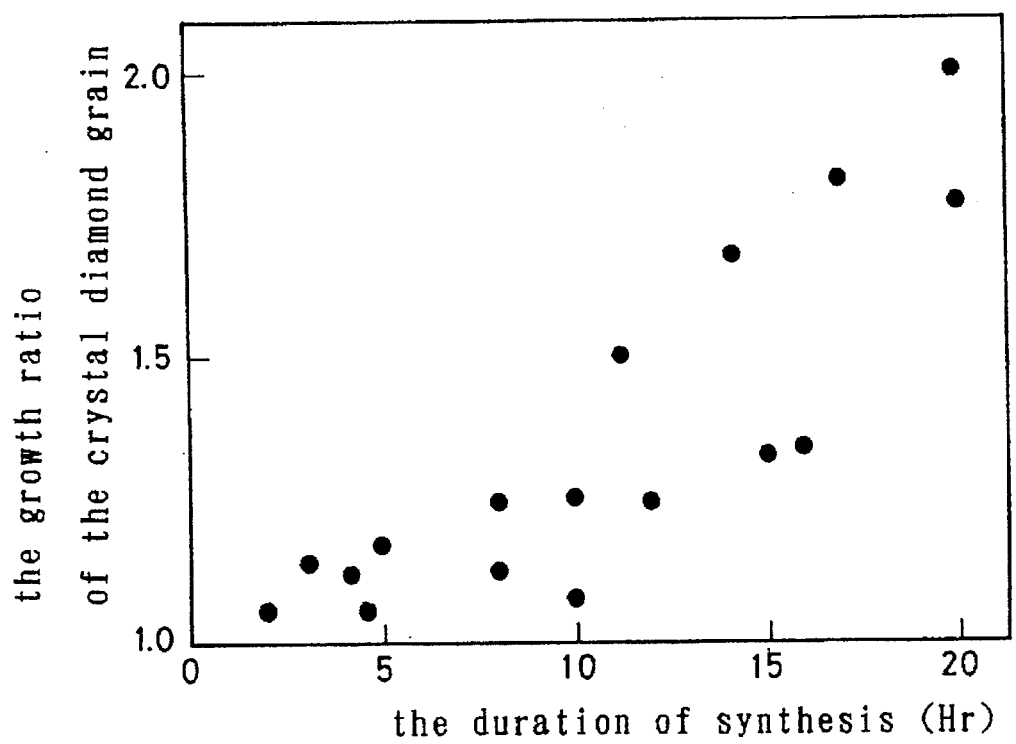
FIG. 7 is a figure showing the relation between the growth ratio of the diamond grains used as seed crystals and the duration of diamond synthesis according to the combustion method according to the present invention.
Figure 8:
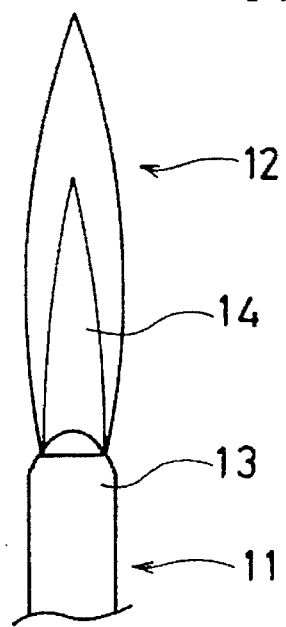
Figure 8:
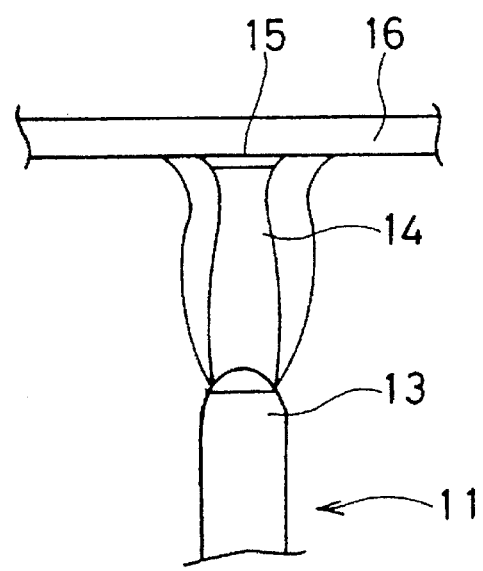

The present invention is described in further detail referring to the attached drawings. FIGS. 1 to 6 show the growth steps of a diamond grain used as the seed crystal in the process for synthesizing diamond using the combustion method according to the present invention, in which FIG. 1 shows the state before initiation of the synthesis, FIG. 2 shows the state after passage of 5 hours, FIG. 3 shows the state after passage of 11 hours, FIG. 4 shows the state after passage of 17 hours, FIG. 5 shows the state after passage of 20 hours, and FIG. 6 shows the state after passage of 26 hours.

In FIG. 1, a diamond grain obtained by high temperature high pressure method and about 800 μm in diameter was buried as a seed crystal diamond 2 in a copper plate 1 used as the substrate. The seed crystal diamond was buried in the substrate using an ordinary press at a depth of about 400 μm i.e., about the half of the diameter of the diamond. Then, the diamond synthesis using the combustion method was conducted by setting the (100) plane of the seed crystal diamond 2 vertical to the flame, using a flame having obtained by mixing oxygen and acetylene at a mixing ratio of $O_2/C_2H_2$ of 1.05 and having an acetylene feather 13 mm in length. The copper plate was placed at a distance of 10 mm from the torch. The substrate was cooled by direct cooling which comprises applying an air jet to the back of the copper substrate 1 into which the seed crystal diamond 2 was buried.

During the above synthesis, the growth process of the seed crystal diamond 2 with the passage of time was observed using a SBM (scanning electron microscope). The results are shown in FIGS. 2 to 6.

According to the observation during the synthesis, the growth of the seed crystal diamond 2 proceeded by planar extension of the (100) plane. In the initial stage of the growth, the growth rate of the edges each extending from the apices of the (100) plane dominated over those of the other parts to develop 4 rounded edges. The four sides of the square developed uniformly thereafter. After passage of 5 hours since the initiation of the experiment, the crystal grew to yield a major diameter being increased from the initial length of 800 μm to 950 μm. The flat surface of the initial (100) plane as observed in FIG. 1 was roughened to yield a rough surface as is shown in FIG. 2. On increasing the magnification, the toughened (100) plane as observed in FIG. 2 was confirmed to be porous with numerous fine pores being distributed over the plane. On the other hand, the (111) plane in the state as is shown in FIG. 2 exhibited an inferior appearance as compared with the (100) plane; moreover, a secondary abnormal growth was observed to occur on the (111) plane instantaneously after the initiation of the synthesis.

After passage of 11 hours, the SEM image as is shown in FIG. 3 reveals that the (100) plane had recovered a flat plane. This indicates that a stable period was achieved in the growth process.

In FIG. 4 is shown the state of the crystal after passage of 17 hours. The (100) plane was found to develop into a square having sides as large as 830 μm in length. However, a secondary nucleus was found to generate at the vicinity of the edge between the (100) plane and the (111) plane.

As shown in FIG. 5, after 20 hours since the initiation of the synthesis, the above secondary nucleus was observed to gradually increase its area, and prominent irregularities were found to develop on the previously flat (100) plane.

After 26 hours, the secondary grown surface covered a large part of the (100) plane to leave a small flat portion on the center of the plane as is shown in FIG. 6. At this stage, the initial grain 800 μm in diameter was found to have grown into a large crystal 1.8 mm (1,800 μm) in diameter.

As described in the foregoing, the (100) plane extended stably during the entire synthetic process. In contrast with the case of the (100) plane, a disturbed surface was found to occur on the (111) plane immediately after the initiation of the synthesis. Accordingly, the vicinity of the edge between the (100) plane and the (111) plane became unstable as to generate a secondary growth thereon. It can be seen therefrom that the (100) cubic grains are best suited for use as seed crystals.

In FIG. 7 is shown the relation between the duration of synthesis and the growth ratio of the crystal diamond grain. It can be seen that all the crystal diamond grains grow sluggishly up to 5 hours since the initiation of the experiment, but that they grow with gradually increasing rate thereafter. This corresponds to the transition from a state comprising porous (100) planes being covered with numerous fine pores into a state comprising stacks of flat growth layers. The process according to the present invention enabled fabrication of large diamond grains by growing the initial crystal diamond grain into a grain having a diameter twice as large as the initial diameter in about 20 hours.

In Example 1 referring to FIGS. 1 to 6, a single seed crystal diamond was grown into a large crystal. In Example 2 which is to be described hereinafter, four seed crystals of diamond were buried in contact with each other into a substrate to obtain a single large diamond therefrom.

Pour diamond grains obtained by high temperature high pressure method and each about 800 μm in diameter were buried as diamond crystal grains in a copper plate which was used as the substrate. The diamond crystal grains were buried in such a manner that they may be in contact with each other and that a square portion may he formed at the center of the buried grains. The diamond synthesis using the combustion method was conducted by setting the (100) plane of the diamond crystals vertical to the flame, using a flame having an acetylene feather 13 mm in length and having obtained by mixing oxygen and acetylene at a mixing ratio $O_2/C_2H_2$ of 1.05. The copper plate was placed at a distance of about 8 mm from the torc so that all the four diamond grains may be uniformly covered by the acetylene feather. The substrate was cooled by direct cooling in the same manner as in Example 1, by applying an air jet to the back of the copper substrate into which the crystal diamond grains 2 had been buried.

After conducting diamond synthesis according to the combustion method for 10 hours, the four diamond grains were found to be integrated into a large one to yield a large diamond grain as large as 2.0 mm or more in size.

In Example 2 above, four diamond grains were buried in such a manner that they may be in contact with each other and that a square portion may be formed at the center of the buried grains. However, the present invention is not limited thereto, and as many diamond grains as desired may be buried with the (100) planes thereof being set vertical to the flame, provided that all of the grains are arranged with the intergranular distance among them being taken as such that they are capable of being integrated into a large diamond grain and that they may be all uniformly covered by the feather. Preferably, the maximum distance between the diamond grains is about the same as the diameter of the diamond grains. It becomes economically unfeasible if the intergranular distance were to be taken larger than the grain diameter, because too long an intergranular distance requires an excessively long time not only for forming an integrated diamond grain but also for growing the integrated grain into a large diamond.

If diamond grains of from about 1.8 mm to 2.0 mm in diameter as obtained in the foregoing Examples 1 and 2 were to be synthesized by a high-temperature high-pressure process, the process would have to be conducted for a duration of about 30 hours or longer at a temperature of 1,500° C. and a pressure of 6.0 GPa (about 60,000 atm). It follows that such a process would consume an enormous amount of electric energy and that a large-scale expensive apparatus would be required. In contrast with the case of high-temperature, high-pressure synthesis, the process according to the present invention can be easily carried out with a commercially available acetylene gas burner and a fuel feeding apparatus using inexpensive industrial use diamond grains (those about 800 µm in size and which are obtained by a high-temperature, high-pressure process). Large grains of diamonds can be readily synthesized by simply burying the diamond grains into substrates made of commercially available plates of metals based on copper or aluminum, while cooling the substrate using a jet of compressed air.

INDUSTRIAL APPLICABILITY

As described in the foregoing, the process for synthesizing diamond using combustion method according to the present invention is best suited for easily and economically synthesizing high quality diamond grains 500 µm or larger in size, which were never achieved by conventional combustion methods having developed heretofore.

We claim:

1. A process for synthesizing crystal diamond grains comprising:
   partially burying a seed crystal diamond grain having a (100) plane into a surface of a substrate so as to expose the (100) plane of the grain, and
   contacting the (100) plane of the grain with a combustion flame while cooling the substrate,
   whereby said seed crystal diamond grain grows into a single larger crystal diamond grain having a major diameter of at least 830 µm and at least 1.5 times as large as the seed crystal, while maintaining a (100) plane.

2. The process of claim 1, wherein said seed crystal diamond grain is a (100) cubic grain.

3. The process of claim 1, wherein said single larger diamond grain has a major diameter of 950 µm or more and is at least 1.5 times as large as said seed crystal diamond grain.

4. The process of claim 1, wherein said seed crystal diamond grain is obtained by a high-temperature, high-pressure method.

5. A process for synthesizing crystal diamond grains comprising:
   partially burying two or more seed crystal diamond grains each having a (100) plane into a surface of a substrate so as to expose the (100) plane of each grain, and
   contacting each of said (100) planes of the grains with a combustion flame while cooling the substrate,
   whereby two or more of said seed crystal diamond grains become integrated into a single larger crystal diamond grain having a major diameter of at least 830 µm and which is at least 1.5 times as large as any of the seed crystal diamond grains, while maintaining a (100) plane.

6. The process of claim 5 wherein said seed crystal diamond grains are (100) cubic grains.

7. The process of claim 5, wherein said seed crystal diamond grains are obtained by a high-temperature, high-pressure method.

* * * * *